(12) United States Patent
Lof et al.

(10) Patent No.: US 7,116,404 B2
(45) Date of Patent: Oct. 3, 2006

(54) LITHOGRAPHIC APPARATUS AND DEVICE MANUFACTURING METHOD

(75) Inventors: Joeri Lof, Eindhoven (NL); Joannes Theodoor De Smit, Eindhoven (NL)

(73) Assignee: ASML Netherlands B.V, Veldhoven (NL)

( * ) Notice: Subject to any disclaimer, the term of this patent is extended or adjusted under 35 U.S.C. 154(b) by 167 days.

(21) Appl. No.: 10/879,522

(22) Filed: Jun. 30, 2004

(65) Prior Publication Data
US 2006/0001855 A1    Jan. 5, 2006

(51) Int. Cl.
G03B 27/32    (2006.01)
G03B 27/54    (2006.01)

(52) U.S. Cl. .......................................... 355/67; 355/77
(58) Field of Classification Search ................. 355/53, 355/67, 69, 77
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,040,096 A1 | 3/2002 | Kakizaki et al. | |
| 6,687,041 B1 | 2/2004 | Sandstrom | |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 2002/0195540 A1 | 12/2002 | Higuchi | |
| 2003/0123040 A1 | 7/2003 | Almogy | |
| 2003/0164933 A1 | 9/2003 | Nishi et al. | |
| 2004/0017612 A1* | 1/2004 | Fadel et al. .................. | 359/619 |
| 2004/0041104 A1 | 3/2004 | Liebregts et al. | |
| 2004/0130561 A1 | 7/2004 | Jain | |
| 2004/0189970 A1* | 9/2004 | Takada ......................... | 355/67 |
| 2005/0243295 A1 | 11/2005 | de Jager et al. | |
| 2005/0243298 A1 | 11/2005 | Wu et al. | |

FOREIGN PATENT DOCUMENTS

| | | |
|---|---|---|
| EP | 1 482 375 A2 | 12/2004 |
| WO | WO 98/33096 | 7/1998 |
| WO | WO 98/38597 | 9/1998 |

* cited by examiner

Primary Examiner—Rodney Fuller
(74) Attorney, Agent, or Firm—Sterne, Kessler, Goldstein & Fox P.L.L.C.

(57) ABSTRACT

A system and method for use in a lithographic environment include an illumination system, an array of individually controllable elements, a projection system, and a substrate. The projection system comprises an array of lenses. The apparatus also includes a sensor system and a positioning system controllable to adjust a position and/or an orientation of at least one of the array of elements; a component of the projection system; and the illumination system. The apparatus also includes a control system which controls the array of elements to pattern the beam, and which also receives the intensity signal and controls the positioning system according to the detected intensity distribution to adjust the projected radiation pattern.

42 Claims, 5 Drawing Sheets

FIG 5
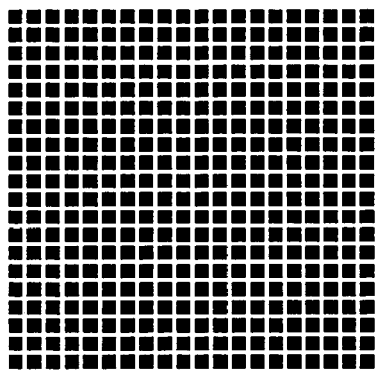
FIG 6
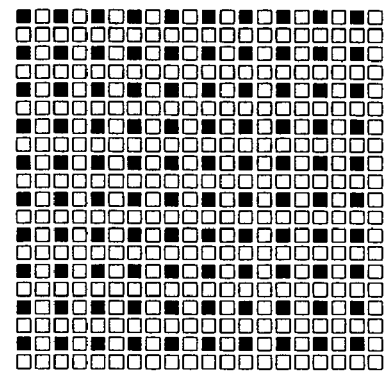
FIG 7
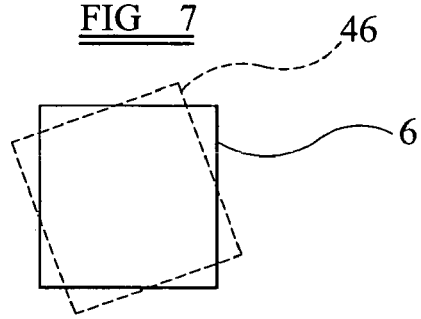
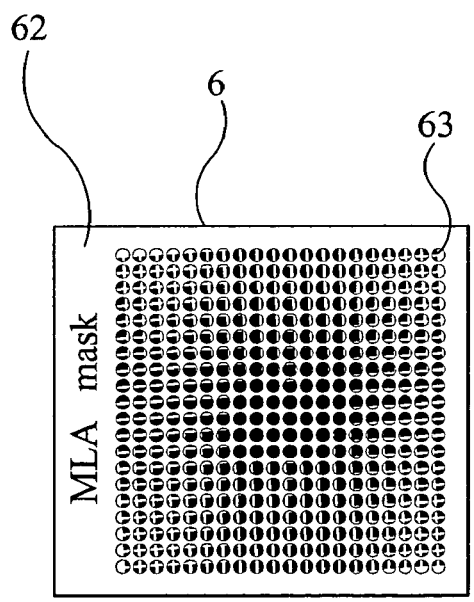
FIG 8
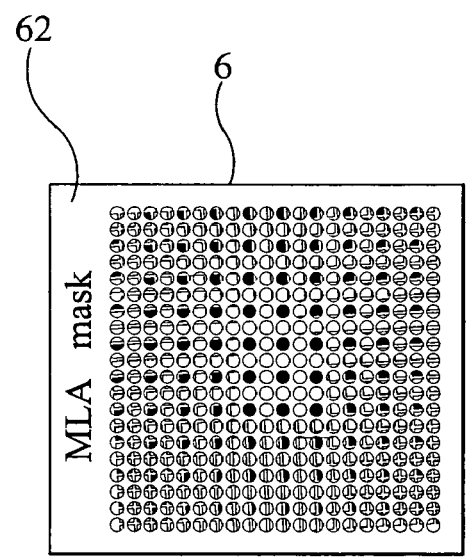
FIG 9

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning" direction), while synchronously scanning the substrate parallel or anti-parallel to this direction.

In maskless lithography it is known to project the patterned beam onto a target portion of the substrate using a projection system that comprises an array of lenses arranged such that each lens receives and focuses a respective portion of the patterned beam. Each lens of the array thus projects a respective spot of radiation onto the substrate, and the array of lenses collectively projects a radiation pattern on the substrate. Such systems are generally referred to as microlens array or MLA systems. In these systems, the patterned beam is typically projected onto the lens array through a beam expander, which comprises a series of lens components and is arranged to provide a substantially parallel radiation beam.

Ideally, the beam patterning and beam projection components should be precisely aligned (i.e., arranged with respect to each other and the target substrate), such that each spot projected onto the target substrate by a lens of the MLA is sharply focused and corresponds to a respective one of the controllable elements. To achieve this, the components should be aligned, such that the projection of the patterned beam on the MLA is in register with the MLA. Each lens of the MLA should receive and focus a portion of the beam that corresponds to a respective one of the controllable elements.

It will be appreciated that the "corresponding respective element" is the element on which the intensity of the portion of beam is primarily dependent. In general, the beam portion received by a particular lens of the MLA will have an intensity that is also dependent on the states of elements adjacent to the "corresponding" element.

Achieving precise alignment of a number of beam patterning and beam projection components to provide the desired correspondence between the projected radiations spots and the controllable elements may pose a problem.

Another possible problem is that projection beam supplied to the patterning means (i.e., the array of controllable elements) may not be uniform (i.e., it may not have a uniform intensity over its cross section). In such cases, even though the patterning and projection components may be set up with precise alignment, the radiation pattern projected onto the substrate may have an unwanted intensity modulation.

Therefore, what is needed is a lithographic system and method that allow for accurate correspondence between the projected radiations spots and the controllable elements and/or a projection beam having a uniform intensity.

SUMMARY OF THE INVENTION

An embodiment of the present invention provides a lithographic apparatus comprising an illumination system for supplying a projection beam of radiation, an array of individually controllable elements serving to impart the projection beam with a pattern in its cross-section, a projection system for projecting the patterned beam onto a target plane, and a substrate table for supporting a substrate, such that a target surface of the substrate is substantially coincident with the target plane. The projection system comprises at least one component. The component (or components) includes an array of lenses arranged to receive the patterned beam, such that each lens of the array receives and focuses a respective portion of the patterned beam and such that the array of lenses projects a corresponding radiation pattern onto the target plane. In this embodiment, the apparatus further comprises a sensor system arranged to detect (i.e., to provide an indication of) an intensity distribution of the projected radiation pattern and to provide an intensity signal indicative of the detected intensity distribution, a positioning system controllable to adjust at least one of a position and an orientation of at least one of: the array of elements, a component of the projection system, and the illumination system, to adjust the projected radiation pattern, and a control system arranged to control the array of elements to impart the projection beam with a predetermined pattern, to receive said intensity signal, and to provide a control signal to control the positioning system according to the detected intensity distribution to adjust the projected radiation pattern.

Thus, in this embodiment, rather than all of the components of the beam supply, patterning, and projection system having a fixed position and/or orientation, the position and/or orientation of at least one of them is adjustable, by means of the control system controlling the positioning system according to the detected intensity distribution.

In one example, for a particular predetermined pattern applied to the beam, the detected intensity distribution at the target plane is dependent on the alignment of the components of the beam supply, patterning, and projection systems. Hence, the lithographic apparatus has the capability to automatically correct the misalignment of at least one component, or indeed to automatically set a deliberate "misalignment" of a component (e.g., to compensate for a non-uniformity in the intensity across the supplied projection beam, or to compensate for the misalignment of another component).

In one example, the positioning system is arranged to provide independent adjustment of a plurality of the beam supply, patterning, and projection system components.

In one example, the positioning system may be controllable to adjust the position and/or orientation of the array of lenses.

In one example, the projection system comprises a first portion, comprising at least one lens, and a second portion, comprising the array of lenses. The first portion is arranged to project the patterned beam onto the array of lenses. In this example, the positioning system may be controllable to adjust a position and/or an orientation of a lens of the first portion. However, in other examples, the projection system may not comprise a lens in addition to the lens array.

For example, rather than a lens system, the projection system may comprise a mirror arrangement to direct the patterned beam (i.e., image the patterning device/programmable mask) onto the array of lenses. Alternatively, a light source, such as a laser, providing a highly parallel beam may be used to illuminate the patterning device, and then the lens array could be directly illuminated with the patterned laser beam reflected from the patterning device.

In one example, the second portion includes a mask comprising an opaque portion arranged to block a portion of the patterned beam. The opaque portion defines an array of windows. Each window is aligned with a respective one of the array of lenses and is transparent to the patterned beam. The mask may be attached to the array of lenses and may, for example, take the form of a sheet or layer of blocking material provided on a surface of a MLA. Through the incorporation of the mask, the intensity distribution of the radiation pattern projected onto the target plane is more sensitive to correct alignment of the various components. In particular, the intensity distribution is sensitive to the correct sizing (i.e., magnification) and orientation of the projection of the patterned beam onto the array of lenses. Furthermore, use of a mask and lens array results in a more pronounced pattern, indicative of misalignments, being observed in the detected intensity distribution.

In one example, the positioning system comprises an actuator controllable to translate (i.e., to adjust a position of) a lens of the first portion longitudinally with respect to the patterned beam so as to adjust a magnification of the projection of the patterned beam on the array of lenses.

In one example, the first portion may comprise a beam expander. The beam expander comprises a series of lens components, the series comprising a first lens and a second lens. In this example, the positioning system comprises an actuator system controllable to translate at least one of the first and second lenses longitudinally with respect to the patterned beam so as to adjust a magnification of the projection of the patterned beam on the array of lenses.

In one example, the positioning system comprises an actuator controllable to translate the array of controllable elements along at least one axis, so as to translate the projection of the patterned beam on the array of lenses relative to the array of lenses.

Additionally, or alternatively, the positioning system may comprise an actuator controllable to rotate the array of controllable elements about an axis so as to rotate the projection of the patterned beam on the array of lenses relative to the array of lenses, and/or an actuator controllable to tilt the array of controllable elements about at least one axis so as to adjust an inclination of the array of elements to the projection beam.

In one example, the positioning system may comprise an actuator controllable to translate the array of lenses in a direction perpendicular to the target plane (e.g., to adjust focus), an actuator controllable to translate the array of lenses along at least one axis parallel to the target plane (e.g., to translate the array of lenses relative to the patterned beam, as projected by the first portion for example), an actuator controllable to rotate the array of lenses about an axis perpendicular to the target plane (e.g., to rotate the array of lenses relative to the patterned beam projected by the first portion), and/or an actuator controllable to tilt the array of lenses about at least one axis (e.g., to adjust an inclination of the array of lenses to the patterned beam projected by the first portion).

In one example, the sensor system may comprise a sensor adapted to detect radiation intensity and a sensor scanning system controllable to scan the sensor over an area of the target plane onto which the radiation pattern is projected. In another example, the sensor system comprises an array of sensors arranged to detect said intensity distribution without requiring scanning.

In one example, the control system is arranged to control the elements to impart the projection beam with a predetermined geometric pattern, such that the detected intensity distribution comprises a moiré pattern, and the control system is arranged to control the positioning system according to the moiré pattern. The control system may be adapted to recognize a plurality of moiré patterns and to control the positioning system according to a recognized pattern to adjust an alignment of the patterned beam to the array of lenses. Each moiré pattern may be characteristic of a misalignment between a respective pair of components, and the control system is preferably arranged to adjust at least one of the pair of components corresponding to the recognized pattern to correct the misalignment.

Another embodiment of the present invention provides a device manufacturing method comprising the steps of providing a projection beam of radiation using an illumination system, using an array of individually controllable elements to impart the projection beam with a predetermined pattern in its cross-section, and projecting the patterned beam of radiation onto a target plane using a projection system. The projection system comprises at least one component. The component (or components) include an array of lenses arranged to receive the patterned beam, such that each lens of the array receives and focuses a respective portion of the patterned beam, and such that the array of lenses projects a corresponding radiation pattern onto the target plane. The method also comprises the steps of detecting an intensity distribution of the projected radiation pattern on the target plane, adjusting at least one of a position and an orientation (e.g., relative to the target plane) of at least one of: the array of elements, a component of the projection system, and the illumination system according to the detected intensity distribution to adjust the projected radiation pattern, providing and supporting a substrate such that a target surface of the substrate is substantially coincident with the target plane, using the array of individually controllable elements to impart the projection beam with a desired pattern in its cross-section; and projecting the beam having said desired pattern onto a target portion of the target surface of the substrate.

In one example, the step of adjusting may comprise adjusting a position and/or an orientation of the array of lenses.

In one example, the projection system comprises a first portion, comprising at least one lens, and a second portion, comprising the array of lenses, the first portion being arranged to project the patterned beam onto the array of lenses, and the step of adjusting comprises adjusting a position and/or an orientation of a lens of the first portion.

In one example, the step of adjusting may comprise one or more of the following: (1) translating a lens of the first portion (e.g., which may comprise a beam expander) longitudinally with respect to the patterned beam so as to adjust a magnification of the projection of the patterned beam on the array of lenses; (2) translating the array of controllable elements along at least one axis, so as to translate the projection of the patterned beam on the array of lenses relative to the array of lenses; (3) rotating the array of controllable elements about an axis, so as to rotate the projection of the patterned beam on the array of lenses relative to the array of lenses; (4) tilting the array of controllable elements about at least one axis, so as to adjust an inclination of the array of elements to the projection beam; (5) translating the array of lenses in a direction perpendicular to the target plane; (6) translating the array of lenses along at least one axis parallel to the target plane, so as to translate the array of lenses relative to the patterned beam projected by the first portion; (7) rotating the array of lenses about an axis perpendicular to the target plane, so as to rotate the array of lenses relative to the patterned beam projected by the first portion; and/or (8) tilting the array of lenses about at least one axis, so as to adjust an inclination of the array of lenses to the patterned beam projected by the first portion.

In one example, the step of detecting may comprise providing and arranging a sensor to detect radiation intensity and scanning the sensor over an area of the target plane onto which the radiation pattern is projected, or alternatively, may comprise providing and arranging an array of sensors to detect said intensity distribution.

In one example, the method further comprises the step of recognizing a pattern in the detected intensity distribution. The recognized pattern is characteristic of a misalignment between a pair of components selected from the following list: the array of elements, a component of the projection system (e.g., a lens of the first portion, and/or the array of lenses), and the illumination system. In this example, the step of adjusting comprises adjusting the position and/or orientation of at least one of the selected pair to correct the misalignment.

In one example, the predetermined pattern applied to the beam is a geometric pattern, and the step of detecting comprises detecting a moiré pattern in the projected radiation pattern. The step of adjusting then comprises adjusting at least one of the listed components according to the detected moiré pattern.

In one example, the method may further comprise the step of recognizing the detected moiré pattern from a plurality of moiré patterns, each moiré pattern being characteristic of a misalignment between a respective pair of components. The step of adjusting then comprises adjusting at least one of the respective pair corresponding to the detected moiré pattern.

In one example, the step of adjusting comprises aligning the array of controllable elements and the array of lenses.

In one example, the step of adjusting comprises adjusting a position and/or an orientation of at least one of the listed components to compensate for a non-uniformity of intensity across the projection beam. This adjustment may thus comprise the deliberate setting of a misalignment, e.g. between the array of controllable elements and the array of lenses to compensate for the non-uniformity in the supplied beam.

In one example, the method further comprises the steps of setting the positions and orientations of the array of elements, the components of the projection system, and the illumination system, detecting a corresponding intensity distribution of the projected radiation pattern on the target plane, moving at least one of the array of elements, a component of the projection system, and the illumination system, detecting a corresponding change in the intensity distribution of the projected radiation pattern on the target plane, and using the change in intensity distribution to determine an optimal position for at least one the array of elements, a component of the projection system, and the illumination system.

In this example, by modeling the change of detected pattern as a function of the movement of a particular imaging system element or component (or of a number of elements/components) it may thus be possible to determine a more accurate estimate of the optimal position, by interpolation.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 5 depicts a predetermined pattern applied to a cross section of a projection beam, according to one embodiment of the invention.

FIG. 6 depicts another predetermined pattern applied to a cross section of a projection beam, according to one embodiment of the invention.

FIG. 7 is a schematic representation of a rotational misalignment (i.e., error) between a MLA and a projection of a patterned beam on an MLA, according to one embodiment of the invention.

FIG. 8 is a schematic representation of the radiation pattern projected onto the target plane through a MLA comprising a mask when the projection beam is patterned according to FIG. 5 and when there is a rotational misalignment as depicted in FIG. 7.

FIG. 9 is a schematic representation of the radiation pattern projected onto the target plane through a MLA comprising a mask when the projection beam is patterned according to FIG. 6 and when there is a rotational misalignment as depicted in FIG. 7.

The present invention will now be described with reference to the accompanying drawings. In the drawings, like reference numbers may indicate identical or functionally similar elements.

DETAILED DESCRIPTION OF THE EMBODIMENTS

Overview and Terminology

Figure 1:
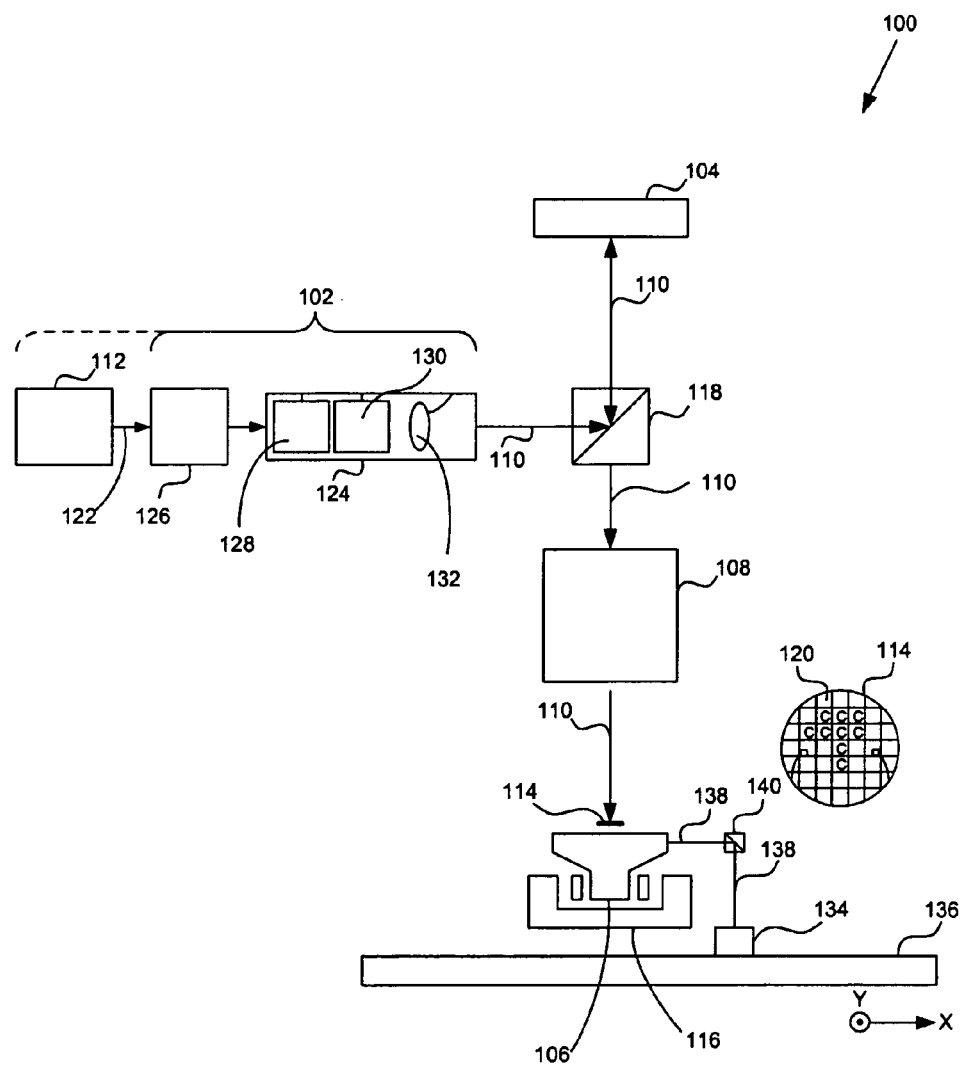
FIG. 1 depicts a lithographic apparatus, according to one embodiment of the invention.

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "misalignment" is to be interpreted in its broad sense, encompassing any deviation in position, orientation, or separation of one component relative to another with respect to a nominal ideal.

The term "moiré pattern" is being used in a broad sense. It encompasses any pattern in the projected radiation pattern arising from the projection of a geometrically patterned beam through a geometric array of lenses.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Lithographic Projection Apparatus

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a projection beam 110 of radiation (e.g., UV radiation), which in this particular case also comprises a radiation source 112.

An array of individually controllable elements 104 (e.g., a programmable mirror array) can be used for applying a pattern to projection beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, projection beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that projection beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 may be used to project a patterned projection beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned projection beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned projection beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned projection beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned projection beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned projection beam 110 scans across substrate 114 and exposes it.

Combinations and/or variations on the above described modes of use or entirely different modes of use may also be employed.

In the embodiment shown in FIG. 1, array of individually controllable elements 104 is a programmable mirror array. Programmable mirror array 104, comprises a matrix arrangement of tiny mirrors, each of which can be individually tilted about an axis. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern.

In one example, the series of states includes: (a) a black state in which radiation reflected by the mirror makes a minimum, or even a zero contribution to the intensity distribution of its corresponding pixel; (b) a whitest state in which the reflected radiation makes a maximum contribution; and (c) a plurality of states in between in which the reflected radiation makes intermediate contributions. The states are divided into a normal set, used for normal beam patterning/printing, and a compensation set, used for compensating for the effects of defective elements. The normal set comprises the black state and a first group of the intermediate states. This first group will be described as grey states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states are being described as white states, it will be appreciated that this is simply to facilitate the distinction between the normal and compensatory exposure steps. The entire plurality of states could alternatively be described as a sequence of grey states, between black and white, selectable to enable grey-scale printing.

Second Exemplary Lithographic Apparatus

Figure 2:
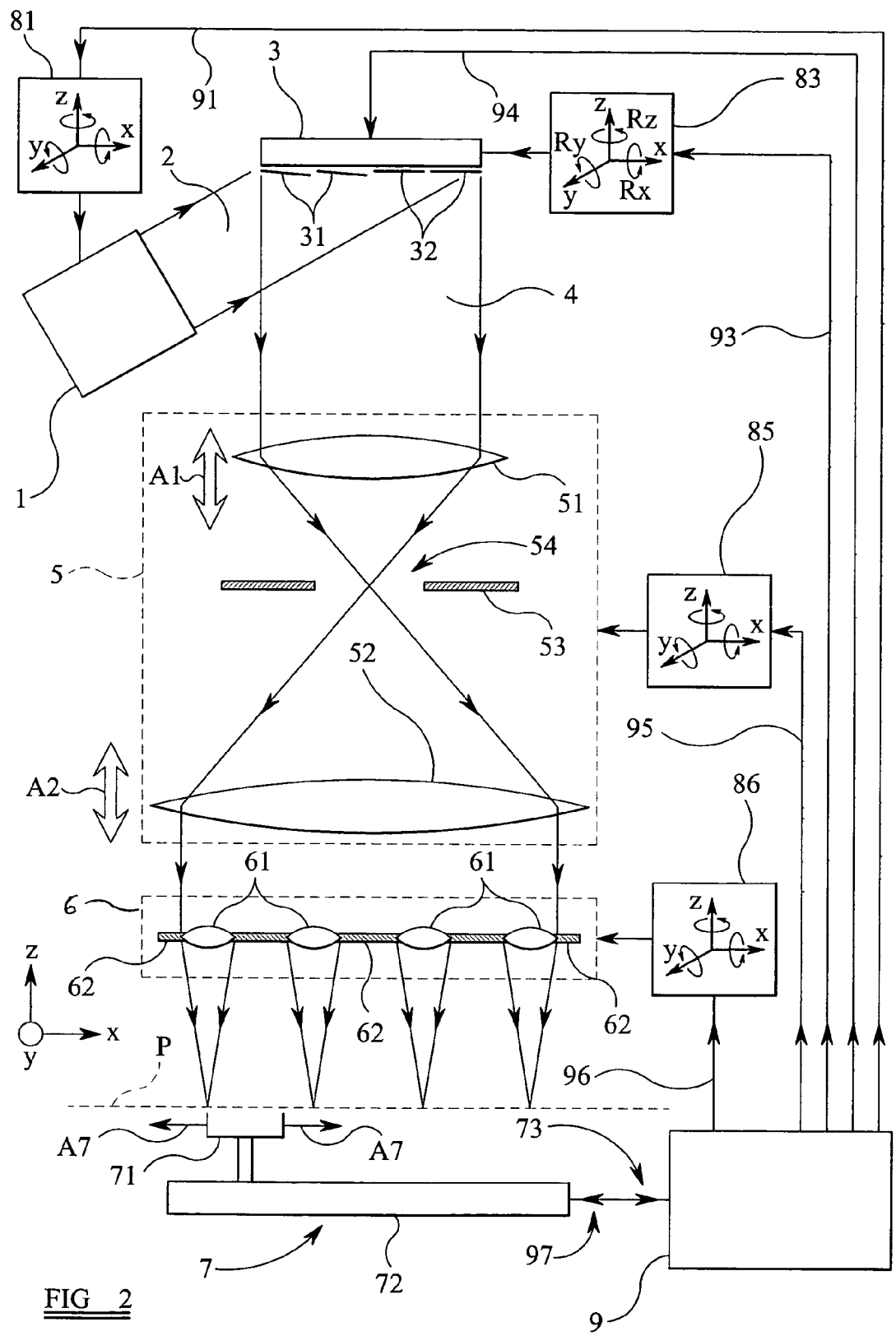
FIG. 2 depicts a lithographic apparatus, according to one embodiment of the invention.

FIG. 2 depicts a lithographic apparatus, according to one embodiment of the invention. In this embodiment, an illumination system 1 is arranged to supply a projection beam 2 of radiation directly to patterning means 3. Patterning means 3 comprises an array of individually controllable elements 31, 32. For simplicity, only four of elements 31, 32 are shown, while in practice there may be as many as a million controllable elements 31, 32, or more. In this example, elements 31, 32 are mirrors whose tilt angles can be set by application of an appropriate control signal 94 from a control system 9.

It will be appreciated that other forms of controllable elements 31, 32 may be used. For example, the controllable elements may be moveable diffraction gratings, such as those found in a grating light valves manufactured by Silicon Light Machines of Sunnyvale, Calif.

Returning to FIG. 2, in this embodiment, two of elements 31 are set to a nominal "white" position and two elements 32 are set to a nominal "black" position. Array 3 imparts a pattern to projection beam 2. Patterned beam 4 reflected from array 3 is then projected onto a target plane P by a projection system, which comprises a first portion 5 and a second portion 6.

In this embodiment, first portion 5 is a beam expander that comprises a first lens 51, which is arranged to receive a substantially parallel patterned beam 4 from array 3 and focus beam 4, such that it passes through an aperture 54 in an aperture stop 53. Patterned beam 4 is then expanded by a second lens 52 (e.g., a field lens) into a substantially parallel beam that is delivered to second portion 6.

In this embodiment, second portion 6 comprises an array of lenses 61, which extend transversely to a beam direction, and an opaque masking structure 62, which is arranged to block a portion of patterned beam 4 falling between adjacent lenses. Thus, each of array of lenses 61 receives and focuses a respective portion of patterned beam 4 to form a corresponding spot of radiation on target plane P. In one example, the portion of patterned beam 4 incident on each lens should correspond to a respective one of controllable elements 31, 32 of array 3.

In the embodiment shown in FIG. 2, rather than array of lenses 61 projecting a radiation pattern onto a surface of a target substrate (not shown), the lithographic apparatus is in a set-up configuration. The target substrate has not yet been positioned under array of lenses 61. Instead, a sensor system 7 is arranged to measure an intensity distribution of the radiation pattern projected onto the target plane P. In this example, sensor system 7 comprises a sensor 71 and a scanning system 72 controllable with a control signal 97 to scan senor 71 across a region of the target plane P in the directions shown by arrows A7. Sensor system 7 provides an intensity signal 73 to control system 9.

Based on detected intensity distribution, control system 9 is arranged to provide control signals 91, 93, 95, 96 to a plurality of actuators 81, 83, 85, 86 to adjust positions and/or orientations of any one of the beam supply, beam patterning, and beam projection systems.

For example, an actuator 83 is coupled to array 3 and is controllable to translate array 3 along any one of three mutually perpendicular axes (labeled x, y and z) and to rotate array 3 about these three axes. In the figure, the z axis is generally perpendicular to the target plane P and the x and y axes are parallel to the target plane P. It will be appreciated that rotation of array 3 about the x or y axes can be referred to as titling array 3 relative to the target plane P.

An actuator 86 is coupled to second portion 6 of the projection system and is controllable to translate and rotate lens array 61 along and about the three mutually perpendicular axes.

An actuator 85 provides adjustment of components in beam expander 5.

An actuator 81 provides adjustment of the position and orientation of illumination system 1.

It will be appreciated that although FIG. 2 shows an embodiment in which illumination system 1, array 3, beam expander 5, lens array 61 are each coupled to a respective actuator giving adjustment of position and orientation along and about all three axes, in alternative embodiments a reduced number of actuators, giving more restricted adjustment, may be employed. For example, the position of illumination system 1 may be fixed relative to the target plane P, and actuator 81 may be omitted. In another example, actuator 83 may be arranged to provide only rotational adjustment of array 3. In one example, a single actuator may be employed providing translational or rotational adjustment of a single component about a single axis. Thus, it will be appreciated that the number of actuators used, and the degree of adjustment they provide may be selected to suit particular requirements.

Returning to the embodiment shown in FIG. 2, actuator 85 coupled to beam expander 5 is controllable to independently adjust the positions of lenses 51 and 52 along the beam direction (which in the figure corresponds to the z direction) as indicated by arrows A1 and A2. This allows control system 9 to adjust magnification of patterned beam 4 and a size of the projection of patterned beam 4 onto array of lenses 61.

In one example, array 3 and array of lenses 61 can be independently rotated about the z axis and independently translated along the x and y axes by their respective actuators 83, 86. In conjunction with the adjustable magnification provided by beam expander 5, this allows the projection of patterned beam 4 onto array of lenses 61 to be brought into register with array of lenses 61 such that each lens 61 receives a portion of the beam corresponding to a respective one of controllable elements 31, 32.

Exemplary MLA

Figure 3:
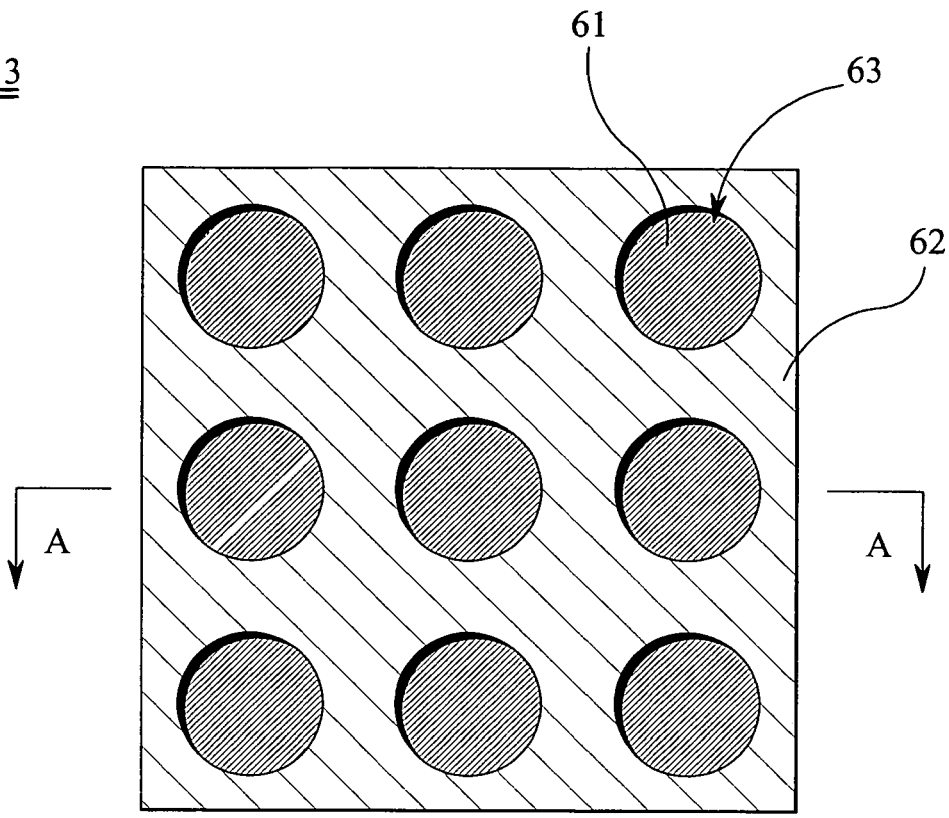
FIG. 3 is a schematic plan view of a micro lens array (MLA), according to one embodiment of the invention.
Figure 4:
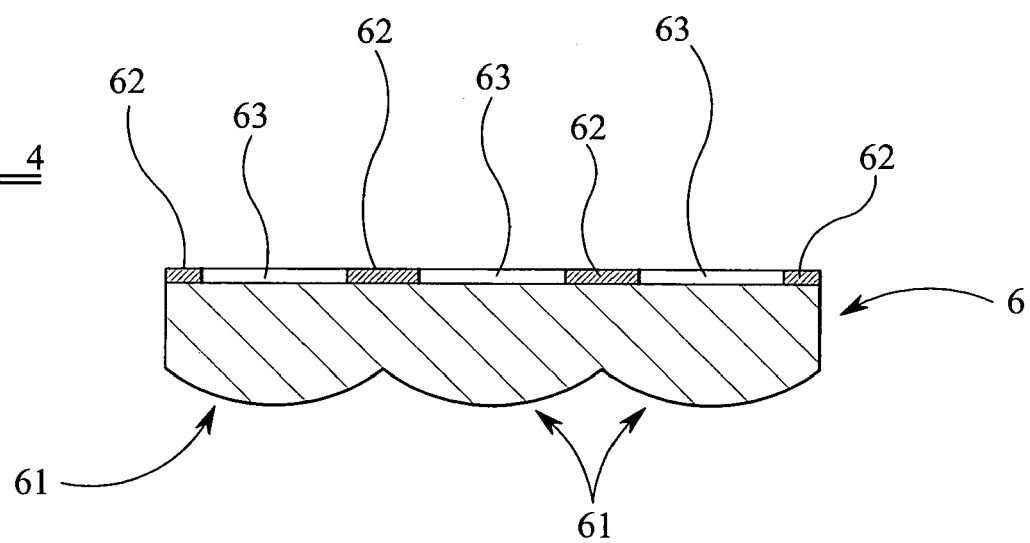
FIG. 4 is a schematic cross sectional view, along line A—A of the MLA of FIG. 3.

FIG. 3 is a schematic plan view of a micro lens array (MLA), according to one embodiment of the invention. FIG. 4 is a schematic cross sectional view, along line A—A of the MLA of FIG. 3. In this embodiment, the MLA comprises a body of transparent material having a flat upper surface and a lower surface shaped to define a plurality of lenses 61. The MLA also comprises a mask structure, in the form of layer 62 of opaque material attached to the upper, flat surface of the transparent body. An array of circular windows 63 is formed in opaque layer 62, each window 63 being centered on a respective one of lens portions 61. It is to be appreciate that, although an array of nine windows 63 is shown, in practice, the MLA may comprise as up to, or more than, one million microlenses.

Exemplary Patterning of a Projection Beam

FIG. 5 depicts a predetermined pattern applied to a cross section of a projection beam, according to one embodiment of the invention. Black squares represent regions of relatively high light intensity and white lines between the black squares represent regions of relatively low light intensity. In the context of FIG. 2, FIG. 5 can be considered a map representing states of array 3 patterning beam 2. The black squares then represent elements in a "white" state and the white lines simply represent spaces between elements 31,32. The pattern shown in FIG. 5 is a geometric pattern, comprising regions of increased intensity arranged in a rectangular array.

FIG. 6 depicts another predetermined pattern applied to a cross section of a projection beam, according to one embodiment of the invention. The pattern in FIG. 6 can be used for alignment purposes. Again, the black squares represent regions of relatively high light intensity and the white squares and lines represent regions of relatively low light intensity. Also, again if seen as a map of controllable element states, the black squares represent elements in the "white" state and the white squares represent elements in the "black" state.

Exemplary Misalignment Depictions

FIG. 7 is a schematic representation of a rotational misalignment (i.e., error) between a MLA and a projection of a patterned beam on an MLA, according to one embodiment of the invention. FIG. 7 is an exaggerated depiction of the rotation error, i.e., a rotational misalignment between microlens array 6 and projection 46 of patterned beam 4 on microlens array 6. MLA 6 and beam projection 46 are shown looking along the nominal z direction.

FIG. 8 is a schematic representation of the radiation pattern projected onto the target plane through a MLA comprising a mask when the projection beam is patterned according to FIG. 5 and when there is a rotational misalignment as depicted in FIG. 7. FIG. 8 can also be regarded as a view, through the MLA mask, of the patterned beam.

FIG. 9 is a schematic representation of the radiation pattern projected onto the target plane through a MLA comprising a mask when the projection beam is patterned according to FIG. 6 and when there is a rotational misalignment as depicted in FIG. 7.

In the examples shown in FIGS. 8 and 9, it will be appreciated that the rotational error has resulted in the intensity distribution comprising a moiré pattern. This moiré pattern can be thought of as resulting from the projection of a geometrically patterned beam through a geometrical array of MLA mask windows. In each of FIGS. 8 and 9, the moiré pattern in the intensity distribution has a characteristic appearance. There is a modulation in micro-spot intensity in both the x and y directions. The moiré pattern can be regarded as comprising a macro-spot. If a more extensive MLA was used, and the beam was patterned with an element array comprising a correspondingly greater number of elements, then the corresponding moiré pattern would comprise a single macro-spot if the rotational misalignment error was small enough. If the rotational misalignment error increased, however, the moiré pattern would develop further macro-spots, arranged in a regular rectangular array. Thus, the moiré patterns observable in FIGS. 8 and 9 are each characteristic of a rotational misalignment between the MLA and the projection of the patterned beam onto the MLA.

In one example, control system 9 is arranged to recognize this characteristic pattern and make appropriate adjustment to the beam pattern and projection components to correct the error. In the embodiment shown in FIG. 2, this correction can be achieved by controlling actuator 83 and/or actuator 86 to rotate array 3 and/or array of lenses 6 about the z axis. Control system 9 is able to monitor the changes to the projected radiation pattern as the adjustments to the component orientations are made. This feedback enables control system 9 to achieve alignment. When the macro-spots in the intensity distribution disappear, array 3 and array of lenses 6 are in correct rotational alignment with respect to each other.

Figure 10:
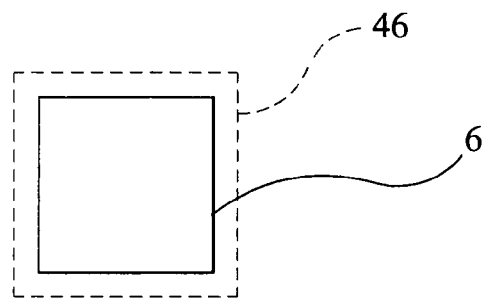
FIG. 10 is a schematic representation of a magnification error between a MLA and a projection of a patterned beam on the MLA, according to one embodiment of the invention.

FIG. 10 is a schematic representation of a magnification error between a MLA and a projection of a patterned beam on the MLA, according to one embodiment of the invention. This magnification error occurs when projection 46 of the patterned beam onto the MLA is larger than MLA 6.

Figure 11:
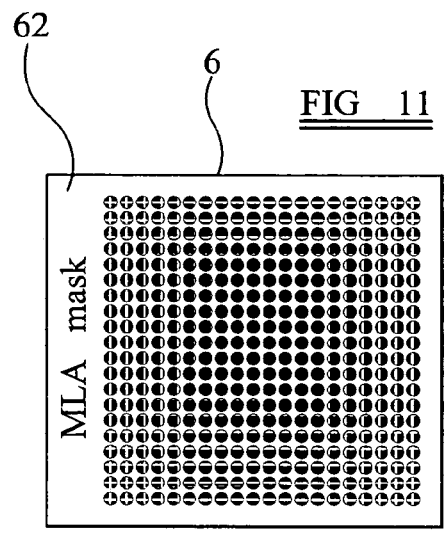
FIG. 11 is a schematic representation of the radiation pattern projected onto a target plane through a MLA comprising a mask when the projection beam is patterned according to FIG. 5 and when there is a magnification error as depicted in FIG. 10.

FIG. 11 is a schematic representation of the radiation pattern projected onto a target plane through a MLA comprising a mask when the projection beam is patterned according to FIG. 5 and when there is a magnification error as depicted in FIG. 10.

Figure 12:
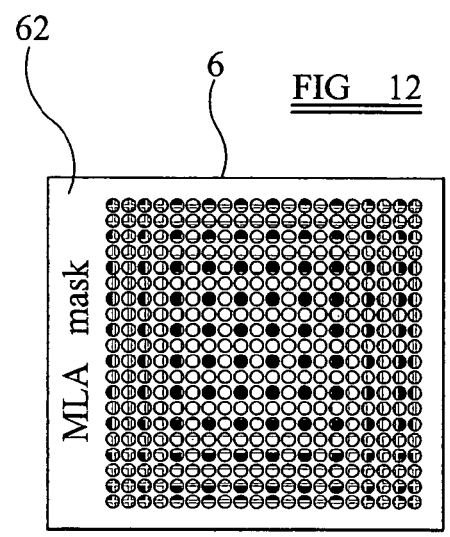
FIG. 12 is a schematic representation of the radiation pattern projected onto the target plane through a MLA comprising a mask when the projection beam is patterned according to FIG. 6 and when there is a magnification error as depicted in FIG. 10.

FIG. 12 is a schematic representation of the radiation pattern projected onto the target plane through a MLA comprising a mask when the projection beam is patterned according to FIG. 6 and when there is a magnification error as depicted in FIG. 10.

FIGS. 11 and 12 show the intensity distributions at the target plane resulting from such an error for beams patterned according to FIGS. 5 and 6, respectively. Again, the intensity distributions each comprise a moiré pattern. The pattern can again be regarded as comprising a macro-spot, and is characteristic of the magnification error. With the apparatus of FIG. 2, control system 9 is adapted to recognize this characteristic pattern and to control actuator 85 to adjust the longitudinal position of at least one of lenses 51 and 52 to reduce the size of the patterned beam projected onto array of lenses 61.

Figure 13:
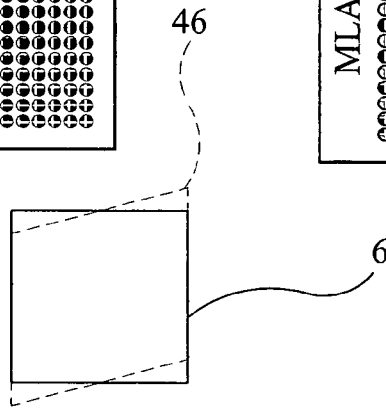
FIG. 13 is a schematic representation of a skew error between a MLA and a projection of a patterned beam on the MLA, according to one embodiment of the invention.

FIG. 13 is a schematic representation of a skew error between a MLA and a projection of a patterned beam on the MLA, according to one embodiment of the invention. FIG. 13 illustrates a skew error where projection 46 of the patterned beam onto MLA 6 is a parallelogram rather than a rectangle.

Figure 14:
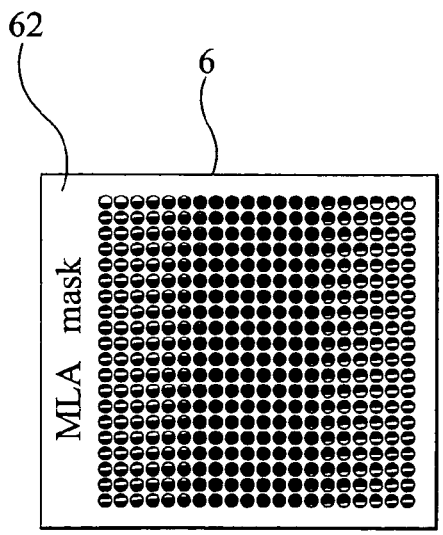
FIG. 14 is a schematic representation of the radiation pattern projected onto the target plane through a MLA comprising a mask when the projection beam is patterned according to FIG. 5 and when there is a skew error as depicted in FIG. 13.

FIG. 14 is a schematic representation of the radiation pattern projected onto the target plane through a MLA comprising a mask when the projection beam is patterned according to FIG. 5 and when there is a skew error as depicted in FIG. 13.

Figure 15:
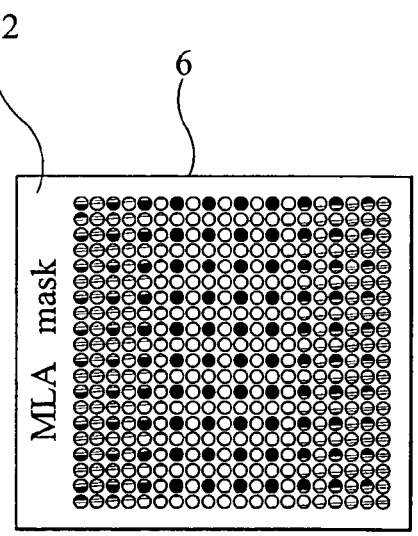
FIG. 15 is a schematic representation of the radiation pattern projected onto the target plane through a MLA comprising a mask when the projection beam is patterned according to FIG. 6 and when there is a skew error as depicted in FIG. 13.

FIG. 15 is a schematic representation of the radiation pattern projected onto the target plane through a MLA comprising a mask when the projection beam is patterned according to FIG. 6 and when there is a skew error as depicted in FIG. 13.

FIGS. 14 and 15 show the resultant intensity distributions on the target plane when beams patterned according to FIGS. 5 and 6, respectively, are projected through the MLA. For this skew misalignment, the resultant moiré patterns in the intensity distributions comprise macro-lines rather than macro-spots. Thus, this different form of moiré pattern is characteristic of a different type of misalignment error.

In response to detecting and recognizing the moiré patterns shown in FIGS. 14 and 15, control system 9 in FIG. 2 is able to control actuator 83 to tilt array 3 appropriately about at least one of the x and y axes so as to bring projection 46 of the patterned beam into register with MLA 6.

It will be appreciated that a number of different types of misalignment may be present simultaneously. Thus, the detected intensity distribution may comprise a moiré pattern having a number of characteristic components. In one example, control system 9 can be arranged to detect each characteristic component and make appropriate adjustments to the positions and/or orientations of the beam patterning and projection systems.

Also, it will be appreciated that control system 9 may be arranged to control array 3 to apply a plurality of different predetermined patterns to beam 2. For example, these predetermined patterns may include, but are not limited to, arrays of lines or arrays of concentric circles. It will be apparent upon reading this description to one of ordinary skill in the art that with the appropriate selection of the predetermined pattern to be applied to the beam, detection of particular types of misalignment error may be facilitated.

It is to be appreciated that the sensor systems in various embodiments of the invention may comprise a light detector, which may be located and supported on the substrate table. The detector may be arranged to scan over the entire area of the MLA to make a map of the intensity over this area. It is to be appreciated that the light sensor can also be used to measure the uniformity over the exposure field. In certain instances it may be desirable to intentionally introduce a misalignment (i.e., an error) in order to correct for non-uniformity over the image field caused by the illumination source. The sensor/detector may take a variety of forms. For example, it may be a light sensitive device such as a CCD or CMOS chip.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
an illumination system that supplies a beam of radiation;
an array of individually controllable elements that pattern the beam;
a projection system that projects the patterned beam onto a target plane;
a substrate table that supports a substrate, such that a target surface of the substrate is substantially coincident with the target plane;
a sensor system that detects an intensity distribution of a radiation pattern in the patterned beam and that provides an intensity signal indicative of the detected intensity distribution;
a positioning system that adjusts the radiation pattern by adjusting a position and an orientation of at least one of the array of individually controllable elements, a component of the projection system, and the illumination system; and
a control system that controls the array of individually controllable elements such that they pattern the beam, that directs the radiation pattern on to the sensor system to receive said intensity signal, and that provides a control signal to control the positioning system according to the detected intensity distribution to adjust the radiation pattern,
wherein the projection system comprises at least one component, the at least one component including an array of lenses arranged to receive the patterned beam,
wherein each lens of the array of lenses receives and focuses a respective portion of the patterned beam, and
wherein the array of lenses projects a corresponding radiation pattern onto the target plane.

2. The apparatus of claim 1, wherein the positioning system is controllable to adjust at least one of a position and an orientation of the array of lenses.

3. The apparatus of claim 1, wherein the projection system comprises:
a first portion comprising at least one lens; and
a second portion comprising the array of lenses,
wherein the first portion projects the patterned beam onto the array of lenses.

4. The apparatus of claim 3, wherein the positioning system adjusts at least one of a position and an orientation of the at least one lens of the first portion.

5. The apparatus of claim 3, wherein the second portion comprises:
a mask having an opaque portion arranged to block a portion of the patterned beam, the opaque portion defining an array of windows, each window being aligned with a respective one of the array of lenses and being transparent to the patterned beam.

6. The apparatus of claim 5, wherein the mask is attached to the array of lenses.

7. The apparatus of claim 3, wherein the positioning system comprises:
an actuator that moves the at least one lens of the first portion longitudinally with respect to the patterned beam, so as to adjust a magnification of the patterned beam with respect to the array of lenses.

8. The apparatus of claim 3, wherein the first portion comprises:
a beam expander comprising a series of lens components including a first lens and a second lens.

9. The apparatus of claim 8, wherein the positioning system comprises:
an actuator system that moves at least one of the first and second lenses longitudinally with respect to the patterned beam, so as to adjust a magnification of the patterned beam with respect to the array of lenses.

10. The apparatus of claim 1, wherein the positioning system comprises:
an actuator that moves the array of controllable elements along at least one axis, so as move the projection of the patterned beam on the array of lenses relative to the array of lenses.

11. The apparatus of claim 1, wherein the positioning system comprises:
an actuator that rotates the array of controllable elements about an axis, so as to rotate the projection of the patterned beam on the array of lenses relative to the array of lenses.

12. The apparatus of claim 1, wherein the positioning system comprises:
an actuator that tilts the array of controllable elements about at least one axis, so as to adjust an inclination of the array of controllable elements with respect to the beam.

13. The apparatus of claim 1, wherein the positioning system comprises:
an actuator that moves the array of lenses in a direction perpendicular to the target plane.

14. The apparatus of claim 1, wherein the positioning system comprises:
an actuator that moves the array of lenses along at least one axis parallel to the target plane, so as to move the array of lenses relative to the patterned beam.

15. The apparatus of claim 1, wherein the positioning system comprises:
an actuator that rotates the array of lenses about an axis perpendicular to the target plane, so as to rotate the array of lenses relative to the patterned beam.

16. The apparatus of claim 1, wherein the positioning system comprises:
an actuator that tilts the array of lenses about at least one axis, so as to adjust an inclination of the array of lenses with respect to the patterned beam.

17. The apparatus of claim 1, wherein the sensor system comprises:
a sensor that detects radiation intensity; and
a sensor scanning system that scans the sensor over an area of the target plane onto which the radiation pattern is projected.

18. The apparatus of claim 1, wherein the sensor system comprises:
an array of sensors arranged to detect said intensity distribution.

19. The apparatus of claim 1, wherein:
the control system controls the array of controllable elements pattern the beam with a predetermined geometric pattern, such that the detected intensity distribution comprises a moiré pattern; and
the control system controls the positioning system according to the moiré pattern.

20. The apparatus of claim 19, wherein:
the control system recognizes a plurality of moiré patterns and controls the positioning system according to the recognized pattern to adjust an alignment of the patterned beam with respect to the array of lenses.

21. A device manufacturing method, comprising:
(a) patterning a beam of radiation using an array of individually controllable elements;
(b) projecting the patterned beam onto a target plane using a projection system that includes at least one component;
(c) receiving the patterned beam on the at least one component, such that each lens of an array of lenses receives and focuses a respective portion of the patterned beam;
(d) projecting a corresponding radiation pattern onto the target plane using the array of lenses;
(e) detecting an intensity distribution of the projected radiation pattern at the target plane;
(f) adjusting a position and an orientation of at least one of the array of controllable elements, a component of the projection system, and the illumination system according to the detected intensity distribution to adjust the projected radiation pattern;
(g) providing and supporting a substrate, such that a target surface of the substrate is substantially coincident with the target plane; and
(h) projecting the beam having said pattern onto a target portion of the target surface of the substrate.

22. The method of claim 21, wherein step (f) comprises: adjusting at least one of a position and an orientation of the array of lenses.

23. The method of claim 21, wherein the projection system comprises a first portion including at least one lens and a second portion including the array of lenses, wherein:
the first portion projects the patterned beam onto the array of lenses; and
step (f) comprises adjusting at least one of a position and an orientation of the at least one lens of the first portion.

24. The method of claim 23, wherein step (f) comprises: translating the at least one lens of the first portion longitudinally with respect to the patterned beam, so as to adjust a magnification of the projection of the patterned beam on the array of lenses.

25. The method of claim 24, wherein the first portion comprises a beam expander that includes a series of lens components having a first lens and a second lens, and wherein step (f) comprises:
translating at least one of the first and second lenses longitudinally with respect to the patterned beam, so as to adjust a magnification of the projection of the patterned beam on the array of lenses.

26. The method of claim 21, wherein step (f) comprises: translating the array of controllable elements along at least one axis so as to translate the projection of the patterned beam on the array of lenses relative to the array of lenses.

27. The method of claim 21, wherein step (f) comprises: rotating the array of controllable elements about an axis, so as to rotate the projection of the patterned beam on the array of lenses relative to the array of lenses.

28. The method of claim 21, wherein step (f) comprises: tilting the array of controllable elements about at least one axis so as to adjust an inclination of the array of elements to the beam.

29. The method of claim 21, wherein step (f) comprises: translating the array of lenses in a direction perpendicular to the target plane.

30. The method of claim 21, wherein step (f) comprises: translating the array of lenses along at least one axis parallel to the target plane so as to translate the array of lenses relative to the patterned beam.

31. The method of claim 21, wherein step (f) comprises: rotating the array of lenses about an axis perpendicular to the target plane so as to rotate the array of lenses relative to the patterned beam.

32. The method of claim 21, wherein step (f) comprises: tilting the array of lenses about at least one axis so as to adjust an inclination of the array of lenses to the patterned beam.

33. The method of claim 21, wherein step (e) comprises: detecting radiation intensity with a sensor; and
scanning the sensor over an area of the target plane onto which the radiation pattern is projected.

34. The method of claim 21, wherein step (e) comprises: detecting the intensity distribution using an array of sensors.

35. The method of claim 21, further comprising:
(i) determining a pattern in the detected intensity distribution, the recognized pattern being characteristic of a misalignment between a respective pair of comprising one each of the array of elements, a component of the projection system, and the illumination system; and
wherein step (f) comprises adjusting at least one of a position and an orientation of at least one of the pair to correct the misalignment.

36. The method of claim 21, wherein:
step (e) comprises detecting a moiré pattern in the projected radiation pattern; and
step (f) comprises adjusting at least one of a position and an orientation of at least one of the array of elements, a component of the projection system, and the illumination system according to the detected moiré pattern.

37. The method of claim 36, further comprising:
(i) determining the detected moiré pattern from a plurality of moiré patterns,
wherein step (f) comprises adjusting at least one of a position and an orientation of at least one of the array of elements, a component of the projection system, and the illumination system according to the detected moiré pattern.

38. The method of claim 37, wherein:
each moiré pattern is characteristic of a misalignment between a respective pair selected from the array of controllable elements, a component of the projection system, and the illumination system,
wherein step (t) comprises adjusting at least one of a position and an orientation of at least one of the respective pair corresponding to the detected moiré pattern.

39. The method of claim 21, wherein the step (f) comprises:
aligning the array of controllable elements and the array of lenses.

40. The method of claim 21, wherein step (f) comprises: adjusting at least one of a position and an orientation of at least one of the array of controllable elements, a component of the projection system, and the illumination system, to compensate for a non-uniformity of intensity across the beam.

41. The method of claim 40, wherein step (f) comprises: setting a misalignment between the array of controllable elements and the array of lenses to compensate for said non-uniformity.

42. The method of claim 21, further comprising:
(i) setting the positions and orientations of the array of elements, the components of the projection system, and the illumination system;

(j) detecting a corresponding intensity distribution of the projected radiation pattern on the target plane;
(k) moving at least one of the array of elements, a component of the projection system, and the illumination system;
(l) detecting a corresponding change in the intensity distribution of the projected radiation pattern on the target plane; and
(m) using the change in intensity distribution to determine an optimal position for at least one the array of elements, a component of the projection system, and the illumination system.

* * * * *